United States Patent
Dolin

(10) Patent No.: US 8,432,228 B1
(45) Date of Patent: Apr. 30, 2013

(54) POWER CONTROL CIRCUIT FOR RADIO FREQUENCY POWER AMPLIFIERS

(75) Inventor: Adam Joseph Dolin, Springfield, NJ (US)

(73) Assignee: Anadigics, Inc., Warren, NJ (US)

( * ) Notice: Subject to any disclaimer, the term of this patent is extended or adjusted under 35 U.S.C. 154(b) by 52 days.

(21) Appl. No.: 13/182,693

(22) Filed: Jul. 14, 2011

(51) Int. Cl.
  *H03F 3/04* (2006.01)
(52) U.S. Cl.
  USPC .............................. 330/297; 330/285; 330/296
(58) Field of Classification Search .................. 330/285, 330/296–298, 207 P
  See application file for complete search history.

(56) References Cited

U.S. PATENT DOCUMENTS

| | | | | |
|---|---|---|---|---|
| 6,765,443 | B2 * | 7/2004 | Pehike | 330/296 |
| 7,408,413 | B2 * | 8/2008 | Ripley | 330/285 |

* cited by examiner

*Primary Examiner* — Hieu Nguyen
(74) *Attorney, Agent, or Firm* — William L. Botjer

(57) ABSTRACT

A power control circuit for regulating an output voltage applied to a radio frequency power amplifier. The power control circuit includes an amplifier, a pass transistor and one or more saturation detectors. An input ramp voltage having a magnitude equal to a first voltage level is applied to a negative terminal of the amplifier. The pass transistor provides an output voltage at a drain terminal of the pass transistor. The saturation detector detects a magnitude of a voltage at a gate terminal of the pass transistor and generates a control current based on the magnitude of the voltage at the gate terminal of the pass transistor. The voltage regulating circuit reduces the magnitude of the input ramp voltage from the first voltage level to a third voltage level based on the control current.

13 Claims, 3 Drawing Sheets

POWER CONTROL CIRCUIT FOR RADIO FREQUENCY POWER AMPLIFIERS

BACKGROUND OF THE INVENTION

The present invention generally relates to the field of radio frequency (RF) power amplifiers. More specifically, it relates to Complementary Metal Oxide Semiconductor (CMOS) power control circuits used in the Global System for Mobile (GSM) communication power amplifier modules.

GSM is a digital mobile telephony system used for cellular communication. The GSM technology uses Gaussian Minimum Shift Keying (GMSK) which is a continuous-phase frequency-shift keying (FSK) modulation. GMSK entails passing a modulating signal through a Gaussian filter, subsequent to which a carrier signal is modulated using the filtered modulating signal. Modulating the carrier signal includes varying the frequency of the carrier signal at carrier zero crossing points such that the GMSK modulated carrier signal has a continuous phase and a constant amplitude envelope.

RF power amplifiers which include non-linear power amplifiers are used to amplify the GMSK modulated carrier signal. The amplification provided by such RF power amplifiers is proportional to the amplitude of an input signal. This results in a distorted output signal in a scenario when the amplitude of the input signal varies. Thus, the constant amplitude envelope of the GMSK modulated signals renders such signals immune to distortion due to non-linear amplification. Therefore, RF amplifiers may be used for power control of GMSK modulated signals without distorting the signals. Additionally, the constant amplitude envelope of the GMSK modulated signals permits the RF power amplifiers to operate near saturation, which in turn results in energy efficiency. The energy efficient operation of the RF amplifiers enables reduction in the size of mobile hand set and minimization of the power consumption to conserve life of the battery used in the mobile handset.

The RF output signal is composed of multiple signals having different frequencies spread over a frequency spectrum. In accordance with European Telecommunication Standard Institute (ETSI) specifications, the frequency band of the RF output signal should be limited to a predefined frequency range or have a predefined switching spectrum. The frequency range of the RF output signal spectrum depends upon the operation of the RF power amplifier which in turn is governed by a biasing voltage. Thus, to limit the RF output signal spectrum to a predefined range, a power control circuit is used to control the biasing voltage provided to the RF power amplifier. The operation of the power control circuit is explained below in conjunction with FIG. 1.

FIG. 1 is a schematic representation of a conventional power amplifier module 100. Power amplifier module 100 includes an RF power amplifier block 102 and a power control circuit 104. RF power amplifier block 102 includes one or more power amplifiers. Power control circuit 104 includes an amplifier 106, a pass transistor 108, and a voltage source 110. An analog ramp voltage ($V_{ramp}$) is applied at a negative terminal of amplifier 106.

An output terminal of amplifier 106 is coupled to a gate terminal of pass transistor 108. A source terminal of pass transistor 108 is coupled to voltage source 110. Voltage source 110 provides a voltage ($V_{bat}$) to the source terminal of pass transistor 108 having a maximum magnitude equal to a second voltage level when voltage source 110 is completely charged. A drain terminal of pass transistor 108 is coupled to RF power amplifier block 102. Further, an output voltage ($V_{out}$) is obtained at the drain terminal of pass transistor 108. $V_{out}$ is provided as biasing voltage to the one or more power amplifiers of RF power amplifier block 102.

Power control circuit 104 includes resistor $R_1$ through which $V_{out}$ is fed back as a feedback voltage to a positive terminal of amplifier 106. A first end of resistor $R_1$ is connected to the drain terminal of pass transistor 108. A second end of resistor $R_1$ is connected to the positive terminal of amplifier 106 and a first end of resistor $R_2$. A second end of resistor $R_2$ is coupled to a first end of resistor $R_3$ and a first end of resistor $R_4$. A second end of resistor $R_4$ is connected to ground.

RF power amplifier block 102 amplifies an input RF signal to produce an output RF signal in which the power of the output RF signal is controlled by RF power amplifier block 102. Power control circuit 104 controls the biasing voltage $V_{out}$ which is provided to the one or more power amplifiers of RF power amplifier block 102. The control of the biasing voltage $V_{out}$ in turn controls the power of the output RF signal. Further, power control circuit 104 operates as a low drop-out voltage regulator (LDO). The operation of the LDO is based on a feedback loop, which includes feeding back $V_{out}$ to the positive terminal of amplifier 106. Amplifier 106 provides an amplified error voltage at the output terminal by amplifying a difference between the feedback voltage applied at the positive terminal of amplifier 106 and $V_{ramp}$ applied at the negative terminal of amplifier 106. The amplified error voltage is applied to the gate terminal of pass transistor 108 and has a magnitude equal to $Vg_{pass}$. The feedback voltage depends on $V_{out}$ and is equal to a voltage at the second end of resistor $R_1$. $V_{out}$ depends on the amplified error voltage. For a predefined profile and magnitude of $V_{ramp}$ applied at the negative terminal of amplifier 106, power control circuit 104 regulates $V_{out}$ at the drain terminal of pass transistor 108. As a result of which power at the output of RF amplifier block 102 is controlled.

Power at the output of RF amplifier block 102 is constant under normal operating conditions for an applied voltage $V_{ramp}$ during which the magnitude of $V_{out}$ is sufficiently lower than $V_{bat}$. However, as voltage source 110 discharges, $V_{bat}$ reduces below the maximum magnitude, i.e., the second voltage level, and drops below the $V_{out}$ voltage levels for high power settings. The gain in the error amplifier 106 then decreases since $V_{out}$ exceeds $V_{bat}$. Also, the voltage drop between $V_{bat}$ and $V_{out}$ decreases, causing pass transistor 108 to operate in the triode region. As a result, the unity gain frequency and loop gain of power control circuit 104 degrades and hence the transfer function characteristics of power control circuit 104 become distorted. As a consequence, $V_{out}$ applied to RF power amplifier block 102 is distorted. In addition, $Vg_{pass}$ drops significantly due to the decrease in gain of amplifier 106. This introduces slewing transients and delay in the feedback loop of power control circuit 104 when more current is required to recharge parasitic capacitances at the gate terminal of pass transistor 108. Further, the reduced $V_{bat}$ prevents $V_{out}$ from reaching its maximum value, causing clipping of the ramp voltage profile at output of amplifier 106. As a result, spurious non linear components are introduced in the output of amplifier 106 which degrades $V_{out}$ applied to RF power amplifier block 102.

Due to the reduction in $V_{bat}$, the slewing transients and delays are introduced in the feedback loop of power control circuit 104 and due to the variations in $V_{out}$, spurious frequency components are introduced in the frequency spectrum of the RF output signal. This degrades the RF output signal frequency spectrum and causes the RF output signal to violate the frequency requirements defined by the ETSI.

In light of the above, a need exists for a power control circuit that regulates an output voltage applied to RF power amplifier block. Further, a need exists for a power control circuit that prevents the transfer function characteristics of the power control circuit from becoming distorted, thereby maintaining the required switching spectrum when the magnitude of the voltage provided by the voltage source reduces. Still further, a need exists for a power control circuit that can reduce the effect of slewing due to large capacitance at the gate terminal of pass transistor and prevents the non-linear operation of amplifier, thereby preventing degradation of the switching spectrum. Furthermore, there is a need for a power control circuit that reduces clipping of the applied ramp voltage profile at reduced voltage level of the voltage source.

SUMMARY OF THE INVENTION

An object of the present invention is to provide a power control circuit that regulates the output voltage applied to a RF power amplifier block.

Another object of the present invention is to provide a power control circuit that maintains the desired switching spectrum at reduced voltage level of a voltage source.

Another object of the present invention is to provide a power control circuit that maintains the desired transfer function characteristics of the power control circuit.

Another object of the present invention is to provide a power control circuit that reduces the effect of slewing due to large capacitance at the gate terminal of pass transistor.

Yet another object of the present invention is to provide a power control circuit that reduces clipping of the applied ramp voltage profile at reduced voltage level of the voltage source.

Yet another object of the present invention is to provide a compact power control circuit.

Still another object of the present invention is to provide a power control circuit that optimizes peak efficiency of a RF power amplifier block.

Still another object of the present invention is to provide a power control circuit that minimizes added noise in receive band.

In accordance with the objects of the invention, various embodiments of the invention provide a power control circuit that regulates an output voltage applied to a RF power amplifier block. The power control circuit includes an amplifier, a pass transistor, at least one saturation detector, and a voltage regulating circuit. An input ramp voltage having a magnitude equal to a first voltage level is applied to a negative terminal of the amplifier. The pass transistor provides an output voltage at a drain terminal thereof which is fed back to a positive terminal of the amplifier. The voltage source provides a voltage having a magnitude equal to a second voltage level to a source terminal of the pass transistor. The saturation detector detects a magnitude of a voltage at a gate terminal of the pass transistor and generates a control current based on the magnitude of the voltage at the gate terminal of the pass transistor. The voltage regulating circuit reduces the magnitude of the input ramp voltage from the first voltage level to a third voltage level based on the control current.

In accordance with the objects of the invention, various embodiments of the invention provide a power control circuit for regulating an output voltage applied to a RF power amplifier block. At least one saturation detector detects a magnitude of a voltage at a gate terminal of a pass transistor and increases magnitude of a voltage at a positive terminal of an amplifier based on the magnitude of the voltage at the gate terminal of the pass transistor.

BRIEF DESCRIPTION OF THE DRAWINGS

Various embodiments of the invention will hereinafter be described in conjunction with the appended drawings, provided. To illustrate and not to limit the invention, wherein like designations denote like elements, and in which.

DESCRIPTION OF VARIOUS EMBODIMENTS

Various embodiments of the invention provide a power control circuit for regulating an output voltage applied to a RF power amplifier block. The power control circuit maintains the required switching spectrum when the magnitude of voltage provided by a voltage source reduces. The power control circuit comprises a saturation detector and voltage regulating circuit which regulates input ramp voltage based on magnitude of voltage at a gate terminal of a pass transistor in the power control circuit.

Figure 1:
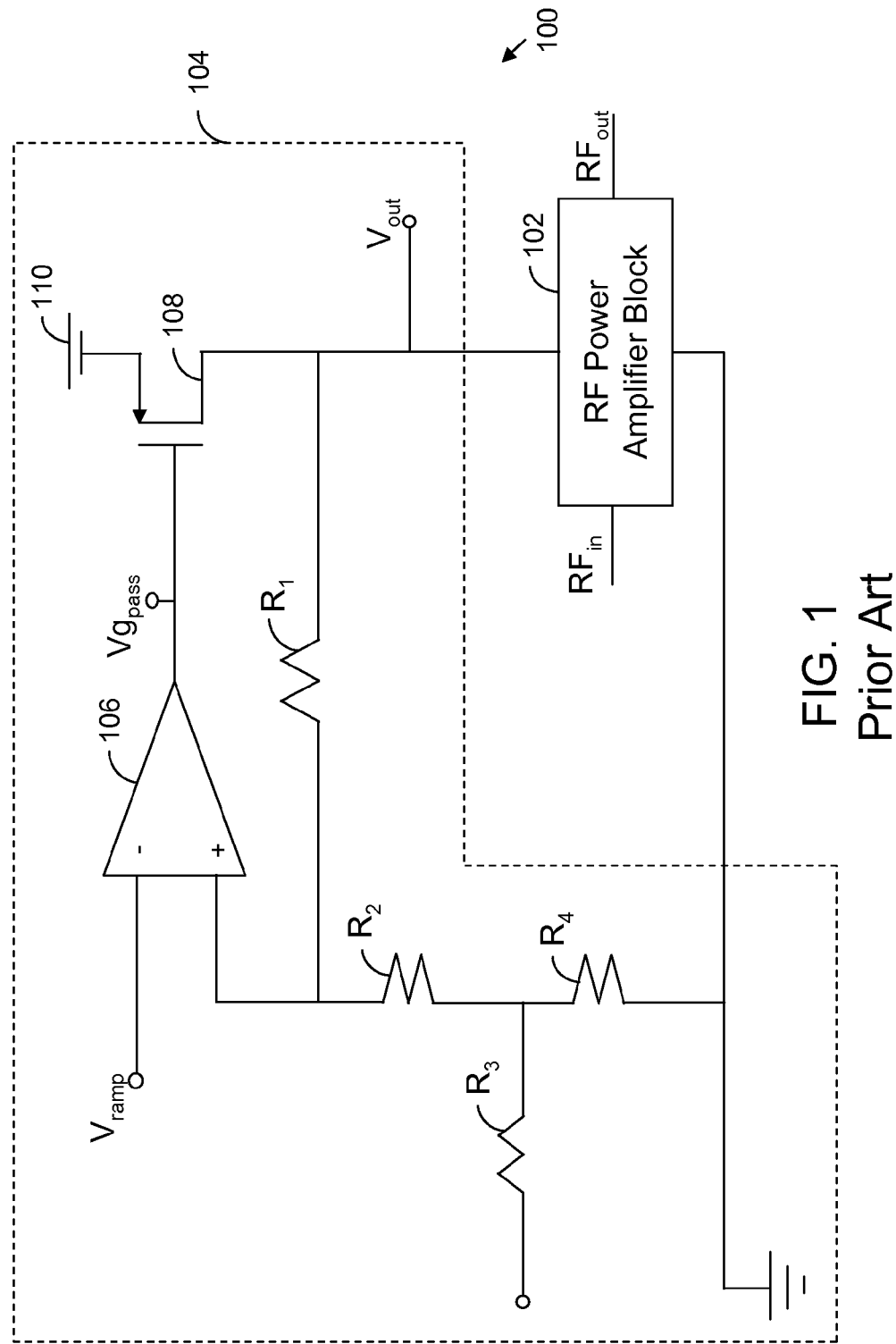
FIG. 1 is a schematic representation of a circuit diagram of a conventional power amplifier module.
Figure 2:
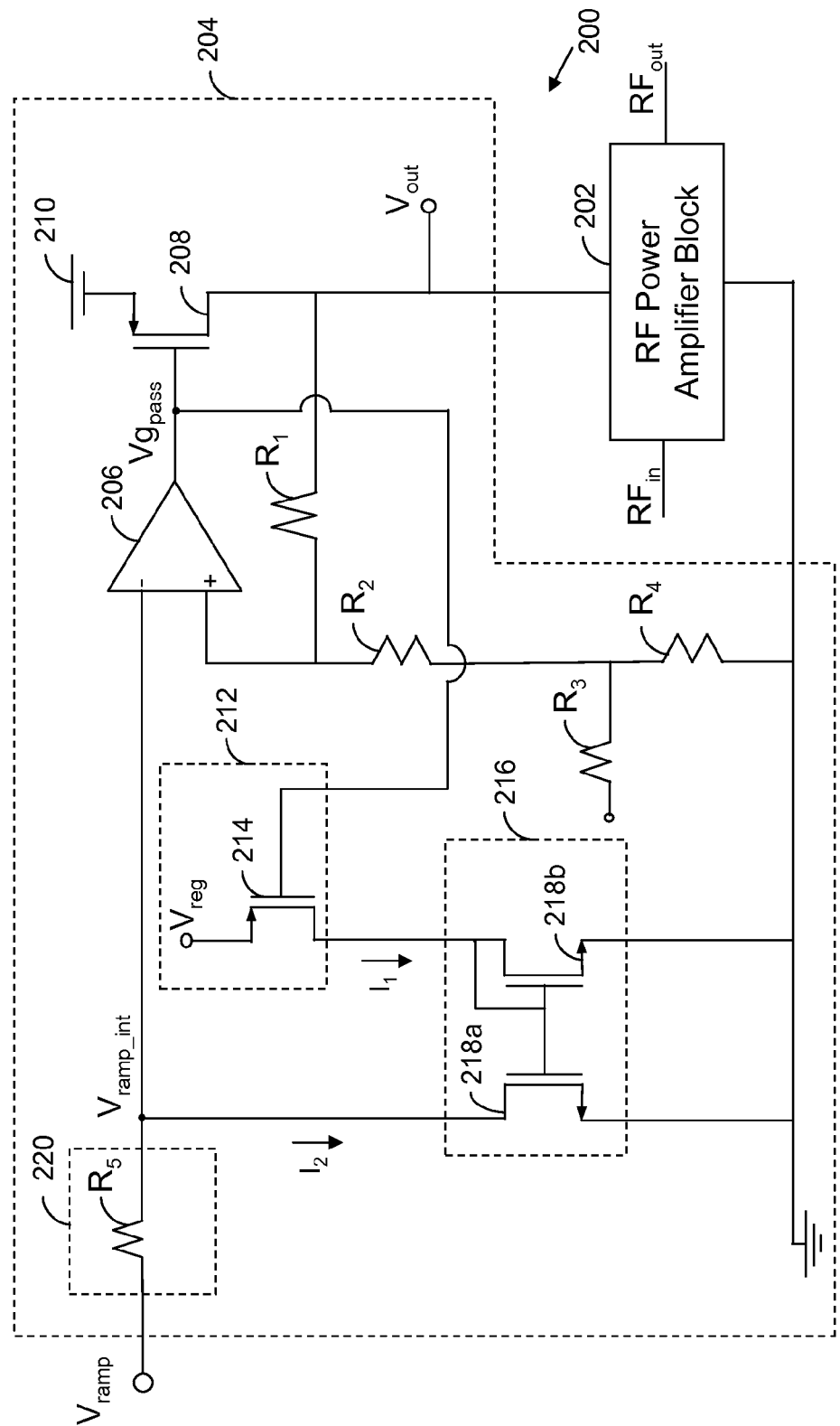
FIG. 2 is a schematic representation of a circuit diagram of a power amplifier module, in accordance with an embodiment of the invention.

FIG. 2 is a schematic representation of a circuit diagram of a power amplifier module 200, in accordance with an embodiment of the invention. Power amplifier module 200 includes a RF power amplifier block 202 and a power control circuit 204. RF Power amplifier block 202 includes one or more power amplifiers. Power control circuit 204 includes an amplifier 206, a pass transistor 208, a voltage source 210, a saturation detector 212, a sense transistor 214, a current mirror 216, transistors 218a and 218b, and a voltage regulating circuit 220. Sense transistor 214 is coupled to a constant regulated voltage source ($V_{reg}$). $V_{reg}$ provides a voltage having a magnitude equal to a fifth voltage level. A first terminal of saturation detector 212, which is a gate terminal of sense transistor 214, is connected to an output terminal of amplifier 206 and a gate terminal of pass transistor 208. A second terminal of saturation detector 212, which is a drain terminal of sense transistor 214, is connected to a first terminal of current mirror 216. A second terminal of current mirror 216 is coupled to an output terminal of voltage regulating circuit 220. In an embodiment of the present invention, voltage regulating circuit 220 includes a resistor $R_5$. An analog ramp voltage ($V_{ramp}$) is applied at a first end of resistor $R_5$. In an alternative embodiment of the present invention, voltage regulating circuit 220 includes a unity gain buffer amplifier connected to the first end of the resistor $R_5$ in which the unity gain buffer amplifier has a negative feedback configuration.

Voltage regulating circuit 220 is coupled to a negative terminal of amplifier 206. An input ramp voltage ($V_{ramp\_int}$) having a magnitude equal to a first voltage level, obtained at a second end of resistor $R_5$, is applied at a negative terminal of amplifier 206. An output terminal of amplifier 206 is coupled to the gate terminal of pass transistor 208. A source terminal of pass transistor 208 is coupled to voltage source 210. In an embodiment of the present invention, voltage source 210 is a direct current (DC) battery. A drain terminal of pass transistor 208 is coupled to RF power amplifier block 202. Further, an output voltage ($V_{out}$) is obtained at the drain terminal of pass transistor 208. $V_{out}$ is provided as biasing voltage to the one or more power amplifiers of RF power amplifier block 202. In an embodiment of the present invention, pass transistor 208 and sense transistor 214 may be Field Effect Transistors (FET). In another embodiment of the present invention, pass transistor 208 and sense transistor 214 may be Metal Oxide Semiconductor Field Effect Transistors (MOSFET).

Power control circuit 204 includes resistor $R_1$ through which $V_{out}$ is fed back as a feedback voltage to a positive terminal of amplifier 206. A first end of resistor $R_1$ is connected to the drain terminal of pass transistor 208. A second end of resistor $R_1$ is connected to the positive terminal of amplifier 206 and a first end of resistor $R_2$. A second end of resistor $R_2$ is coupled to a first end of resistor $R_3$ and a first end of resistor $R_4$. A second end of resistor $R_4$ is connected to ground.

RF power amplifier block 202 amplifies an input RF signal $RF_{in}$ to produce an output RF signal $RF_{out}$ in which the power of the output RF signal is controlled by RF power amplifier block 202. Power control circuit 204 controls the biasing voltage $V_{out}$ which is provided to the one or more power amplifiers of RF power amplifier block 202. The control of the biasing voltage $V_{out}$ in turn controls the power of the output RF signal. Power control circuit 204 operates as a low drop-out voltage regulator (LDO). The operation of the LDO is based on a feedback loop, which includes feeding back $V_{out}$ to the positive terminal of amplifier 206. Amplifier 206 provides an amplified error voltage at the output terminal by amplifying a difference between the feedback voltage applied at the positive terminal of amplifier 206 and $V_{ramp\_int}$ applied at the negative terminal of amplifier 206. The amplified error voltage is applied to the gate terminal of pass transistor 208 and has a magnitude equal to $Vg_{pass}$. The feedback voltage depends on $V_{out}$ and is equal to a voltage at the second end of resistor $R_1$. For a predefined profile and magnitude of $V_{ramp}$ applied at the first terminal of resistor $R_5$, power control circuit 204 regulates $V_{out}$ at the drain terminal of pass transistor 208. Voltage source 210 provides a voltage ($V_{bat}$) to the source terminal of pass transistor 208 having a maximum magnitude equal to a second voltage level. In a scenario when voltage source 210 is a battery, $V_{bat}$ is maximum when the battery is maximum charged. Additionally, when $V_{bat}$ has the maximum magnitude, $V_{ramp\_int}$ is configured to have a magnitude equal to the first voltage level and $V_{out}$ is configured to be less than the maximum voltage level of $V_{bat}$. Pass transistor 208 operates in saturation region when it provides the desired $V_{out}$ at the drain terminal of pass transistor 208.

When $V_{bat}$ reduces below the maximum magnitude, i.e., the second voltage level, due to discharge of voltage source 210, maximum value of $V_{out}$ begins to saturate close to $V_{bat}$. As a result, the gain of error amplifier 206 decreases which causes $Vg_{pass}$ to decrease. At least one saturation detector 212 detects the magnitude of $Vg_{pass}$. When the magnitude of $Vg_{pass}$ is reduced below a fourth voltage level, sense transistor 214 is switched on. In an embodiment of the present invention, the fourth voltage level is equal to a difference between a fifth voltage level and a threshold voltage. The threshold voltage level is equal to difference between the gate terminal voltage of sense transistor 214 and a voltage at a source terminal of sense transistor 214 at which sense transistor 214 is switched on.

When sense transistor 214 is switched on, a control current $I_1$ flows from at least one saturation detector 212 to current mirror 216. This results in a current $I_2$, which is proportional to $I_1$, flowing from voltage regulating circuit 220 towards current mirror 216. Since, $I_2$ flows through resistor $R_5$, a voltage drop equal to $I_2R_5$ occurs across resistor $R_5$. As a result, $V_{ramp\_int}$ is reduced from the first voltage level to a third voltage level equal to $V_{ramp}-I_2R_5$. Therefore, the amplified error voltage, which is equal to $Vg_{pass}$, obtained at the output terminal of amplifier 206 increases.

Due to increase in $Vg_{pass}$, $V_{out}$ reduces and pass transistor 208 operates in the saturation region. Consequently, the loop gain and unity gain frequency increases and hence the desired transfer function characteristics of power control circuit 204 is obtained at the reduced $V_{bat}$. Further, slewing caused due to charging of the large parasitic capacitances at the gate terminal of pass transistor 208 is minimized since $Vg_{pass}$ does not reduce to a low value. Further, clipping of the ramp voltage profile is reduced when $V_{bat}$ reduces since the maximum $V_{out}$ voltage does not saturate. Thus, power control circuit 204 regulates $V_{out}$ and maintains the required switching spectrum behavior when $V_{bat}$ is reduced.

Figure 3:
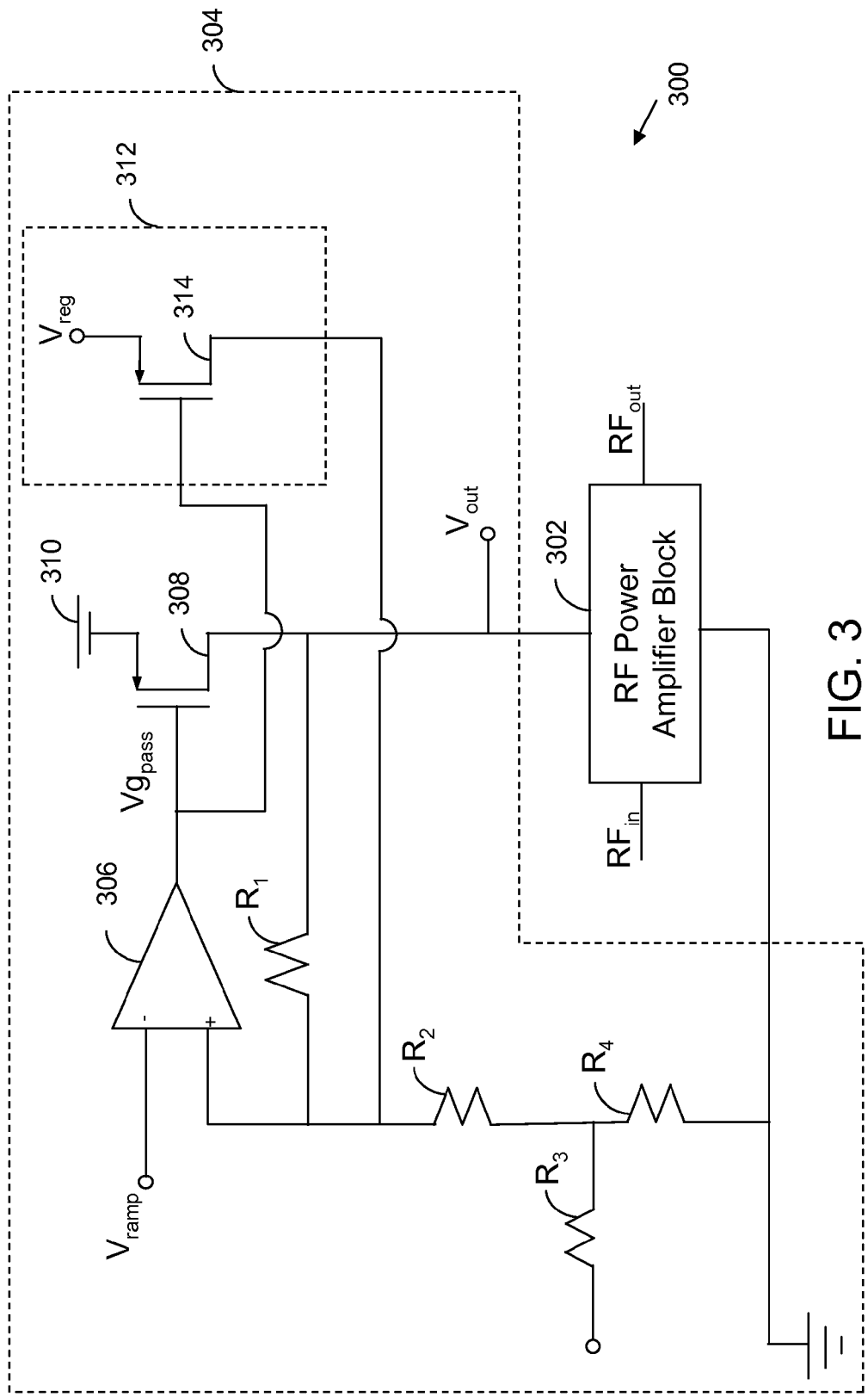
FIG. 3 is a schematic representation of a circuit diagram of a power amplifier module, in accordance with another embodiment of the invention.

FIG. 3 is a schematic representation of a circuit diagram of a power amplifier module 300, in accordance with another embodiment of the present invention. Power amplifier module 300 includes the elements illustrated to be a part of power amplifier module 200 (refer to FIG. 2) except for current mirror 216 and voltage regulating circuit 220 which have been eliminated. Further, power amplifier module 300 has component connection configuration identical to power amplifier module 200 except for the drain terminal of a sense transistor 314 which is connected to the positive terminal of an amplifier 306. Further, the functional operation of components shown to be identical in power amplifier module 200 and power amplifier module 300 is identical.

As explained above, a power control circuit 304 operates as a LDO which includes feeding back $V_{out}$ to the positive terminal of amplifier 306 through resistor $R_1$ as the feedback voltage. Further, amplifier 306 receives $V_{ramp}$ at the negative terminal of amplifier 306. Amplifier 306 provides an amplified error voltage by amplifying a difference between the feedback voltage applied at the positive terminal of amplifier 306 and $V_{ramp}$ applied at the negative terminal of amplifier 306. The amplified error voltage is applied to the gate terminal of a pass transistor 308 and to the gate terminal of a sense transistor 314. The amplified error voltage has a magnitude equal to $Vg_{pass}$. Sense transistor 314 is configured to switch on when $Vg_{pass}$ decreases below the fourth voltage level. As explained in conjunction with FIG. 2, when voltage source 310 is a battery, $V_{bat}$ provided to the source terminal of pass transistor 308 decreases due to discharge of the battery. This in turn leads to a decrease in $Vg_{pass}$. When $Vg_{pass}$ is reduced below the fourth voltage level, sense transistor 314 is switched on which in turn results in an increase in the voltage at the drain terminal of sense transistor 314. Since the drain terminal of sense transistor 314 is connected to the positive terminal of amplifier 306, voltage at the positive terminal of amplifier 306 also increases. This leads to an increase in the amplified error output of amplifier 306 which in turn leads to an increase in $Vg_{pass}$. As a result, $V_{out}$ reduces and pass transistor 308 operates in the saturation region. Consequently, the loop gain and unity gain frequency increases and hence the desired transfer function characteristics of power control circuit 304 is obtained at the reduced $V_{bat}$. Further, slewing caused due to charging of the large parasitic capacitances at the gate terminal of pass transistor 208 is minimized since $Vg_{pass}$ does not reduce to a low value. Further, clipping of the ramp voltage profile is reduced when $V_{bat}$ reduces since the maximum $V_{out}$ voltage does not saturate. Thus power control circuit 304 regulates $V_{out}$ and maintains the required switching spectrum behavior.

Various embodiments of the invention provide several advantages. The power control circuit maintains the switching spectrum behavior defined by the European Telecommunications Standard Institute (ETSI) at reduced voltage level of a voltage source. Further, the power control circuit is compact since it requires a small number of transistors and a small amount of layout space.

Further, the power control circuit optimizes peak efficiency of a RF power amplifier module under nominal conditions. The efficiency of the LDO is equal to ratio of $V_{bat}$ and $V_{out}$. The peak power and efficiency of a power amplifier module increases when the maximum value of $V_{out}$ becomes equal to $V_{bat}$. So, whereas this arrangement achieves proper switching spectrum behavior, it somewhat degrades the power amplifier module's power and efficiency since it decreases the maximum $V_{out}$. Under nominal conditions, when the magnitude of $V_{bat}$ is equal to the second voltage level, the power control circuit does not limit $V_{out}$. When the magnitude of $Vg_{pass}$ is reduced below the fourth voltage level, the power control circuit decreases $V_{out}$ and $Vg_{pass}$ proportionally to $V_{bat}$. As a result, peak power and efficiency of the power amplifier module remains unaffected by reduction in magnitude of $V_{bat}$.

Moreover, the power control circuit has a small number of circuit components that produce noise. As a result, the power control circuit minimizes added noise in the receive band as compared to more complex schemes that have additional components. Still further, the power control circuit reduces clipping of the applied ramp voltage profile at reduced voltage levels of the voltage source. Still further, the power control circuit reduces the effect of slewing caused due to charging of the large parasitic capacitances at the gate terminal of pass transistor While various embodiments of the present invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A power control circuit for regulating an output voltage applied to a power amplifier, the power control circuit comprising:
   (a) an amplifier for receiving an input ramp voltage, wherein the input ramp voltage is applied to a negative terminal of the amplifier, wherein the input ramp voltage has a magnitude equal to a first voltage level;
   (b) a pass transistor, coupled to the amplifier, a voltage source, and the power amplifier, for providing the output voltage at a drain terminal of the pass transistor, wherein the voltage source provides a voltage having a magnitude equal to a second voltage level to a source terminal of the pass transistor;
   (c) at least one saturation detector, coupled to a gate terminal of the pass transistor, for detecting a magnitude of a voltage at the gate terminal of the pass transistor, wherein the at least one saturation detector generates a control current based on the magnitude of the voltage at the gate terminal of the pass transistor; and
   (d) a voltage regulating circuit, coupled to the amplifier and the at least one saturation detector, for reducing the magnitude of the input ramp voltage from the first voltage level to a third voltage level based on the control current.

2. The power control circuit of claim 1, wherein the voltage regulating circuit comprises at least one resistor.

3. The power control circuit of claim 1, wherein the voltage regulating circuit further comprises a unity gain buffer amplifier.

4. The power control circuit of claim 1 further comprising a current mirror, wherein the current mirror is coupled between the at least one saturation detector and the voltage regulating circuit.

5. The power control circuit of claim 1, wherein the power amplifier amplifies radio frequency signals.

6. The power control circuit of claim 1, wherein the at least one saturation detector generates the control current when the magnitude of the voltage at the gate terminal of the pass transistor is reduced below a fourth voltage level.

7. The power control circuit of claim 6, wherein the at least one saturation detector comprises a sense transistor, coupled to a constant regulated voltage source, for generating the control current, wherein the constant regulated voltage source provides a voltage having a magnitude equal to a fifth voltage level.

8. The power control circuit of claim 7, wherein the fourth voltage level is equal to a difference between the fifth voltage level and a threshold voltage, wherein the threshold voltage is equal to difference between a voltage at the gate terminal of the sense transistor and a source terminal of the sense transistor at which the sense transistor is switched on.

9. A power control circuit for regulating an output voltage applied to a power amplifier, the power control circuit comprising:
   (a) an amplifier for receiving a ramp voltage, wherein the ramp voltage is applied to a negative terminal of the amplifier, wherein the ramp voltage has a magnitude equal to a first voltage level;
   (b) a pass transistor, coupled to the amplifier, a voltage source, and the power amplifier, for providing the output voltage at a drain terminal of the pass transistor, wherein the voltage source provides a voltage having a magnitude equal to a second voltage level to a source terminal of the pass transistor;
   (c) at least one saturation detector, wherein the at least one saturation detector comprises a sense transistor coupled to a constant regulated voltage source, wherein a gate terminal of the sense transistor is coupled to a gate terminal of the pass transistor and a positive terminal of the amplifier, wherein the at least one saturation detector:
   detects a magnitude of a voltage at the gate terminal of the pass transistor; and
   increases the magnitude of a voltage at the positive terminal of the amplifier based on the magnitude of the voltage at the gate terminal of the pass transistor.

10. The power control circuit of claim 9, wherein the power amplifier amplifies radio frequency signals.

11. The power control circuit of claim 9, wherein the at least one saturation detector increases the magnitude of the voltage at the positive terminal of the amplifier when the magnitude of the voltage at the gate terminal of the pass transistor is reduced below a fourth voltage level.

12. The power control circuit of claim 9, wherein the constant regulated voltage source provides a voltage having a magnitude equal to a fifth voltage level.

13. The power control circuit of claim 11, wherein the fourth voltage level is equal to a difference between the fifth voltage level and a threshold voltage, wherein the threshold voltage is equal to difference between a voltage at the gate terminal of the sense transistor and a source terminal of the sense transistor at which the sense transistor is switched on.

* * * * *